US006273958B2

(12) United States Patent
Shamouilian et al.

(10) Patent No.: US 6,273,958 B2
(45) Date of Patent: *Aug. 14, 2001

(54) SUBSTRATE SUPPORT FOR PLASMA PROCESSING

(75) Inventors: Shamouil Shamouilian, San Jose; Ananda H. Kumar, Milpitas; Siamak Salimian, Sunnyvale, all of CA (US); Mahmoud Dahimene, Gaithersburg, MD (US); Michael G. Chafin, San Jose, CA (US); Dennis S. Grimard, Ann Arbor, MI (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/329,020

(22) Filed: Jun. 9, 1999

(51) Int. Cl.[7] .............................. C23C 16/00; H05H 1/00
(52) U.S. Cl. ....................... 118/728; 118/723 E; 156/345
(58) Field of Search ................................ 118/728, 723 E, 118/724, 725, 715; 361/234; 279/128; 427/288; 156/345

(56) References Cited

U.S. PATENT DOCUMENTS

| | | | |
|---|---|---|---|
| 4,184,188 | 1/1980 | Briglia ................................. | 361/234 |
| 4,384,918 | 5/1983 | Abe ..................................... | 156/643 |
| 4,399,016 | 8/1983 | Tsukada et al. ................... | 204/192 R |
| 4,665,463 | 5/1987 | Ward et al. ......................... | 361/234 |
| 4,771,730 | 9/1988 | Tezuka ................................ | 118/723 |
| 5,055,964 | 10/1991 | Logan et al. ....................... | 361/234 |
| 5,104,834 | 4/1992 | Watanabe et al. ................. | 501/127 |
| 5,151,845 | 9/1992 | Watanabe et al. ................. | 361/234 |
| 5,155,652 | 10/1992 | Logan et al. ....................... | 361/234 |
| 5,166,856 | 11/1992 | Liporace et al. ................... | 361/233 |
| 5,191,506 | 3/1993 | Logan et al. ....................... | 361/234 |
| 5,238,499 | 8/1993 | Van De Ven et al. ............. | 118/724 |
| 5,326,633 | * 7/1994 | Clough et al. ..................... | 428/288 |
| 5,350,479 | 9/1994 | Collins et al. ..................... | 156/345 |
| 5,376,213 | 12/1994 | Ueda et al. ......................... | 156/345 |

(List continued on next page.)

FOREIGN PATENT DOCUMENTS

| | | |
|---|---|---|
| 0439000 | 1/1991 | (EP) . |
| 0601788 | 12/1993 | (EP) . |
| 1-298721 | 5/1988 | (JP) . |
| 6-182645 | 12/1992 | (JP) . |
| WO99/25006 | 5/1999 | (WO) . |

OTHER PUBLICATIONS

PCT International Search Report, dated Oct. 10, 2000.
Daviet, J., et al., "Electrostatic Clamping Applied to Semiconductor Plasma Processing—I. Theoretical Modeling," *J. Electrochem. Soc.*, vol. 140, No. 11, Nov. 1993; pp. 3245–3255.
Daviet, J., et al., "Electrostatic Clamping Applied to Semiconductor Plasma Processing—II. Experimental Results," *J. Electrochem. Soc.*, vol. 140, No. 11, Nov. 1993; pp. 3256–3261.

*Primary Examiner*—Gregory Mills
*Assistant Examiner*—P. Hassanzadeh
(74) *Attorney, Agent, or Firm*—Janah and Associates

(57) ABSTRACT

A support 55 comprises a dielectric 60 covering a primary electrode 70, the dielectric 60 having a surface 75 adapted to receive a substrate 25 and a conduit 160 that extends through the dielectric 60. The thickness of a portion of the dielectric 60 between an edge 195 of the primary electrode 70 and a surface 180 of the conduit 160 is sufficiently large to reduce the incidence of plasma formation in the conduit 160 when the primary electrode 70 is charged by an RF voltage to form a plasma of gas in the chamber 30 during processing of the substrate 25.

26 Claims, 8 Drawing Sheets

U.S. PATENT DOCUMENTS

| | | | |
|---|---|---|---|
| 5,382,469 | 1/1995 | Kubota et al. | 428/332 |
| 5,542,559 | 8/1996 | Kawakami et al. . | |
| 5,646,814 | 7/1997 | Shamouilian et al. | 361/234 |
| 5,720,818 | 2/1998 | Donde et al. | 118/500 |
| 5,754,391 * | 5/1998 | Bates | 361/234 |
| 5,880,924 * | 3/1999 | Kumar et al. | 361/234 |
| 5,886,866 | 3/1999 | Hausmann . | |

* cited by examiner

SUBSTRATE SUPPORT FOR PLASMA PROCESSING

BACKGROUND

The invention relates to a support for supporting a substrate during plasma processing in a chamber.

Integrated circuits are fabricated by placing a substrate on a support in a chamber, introducing gas into the chamber, and energizing the gas by coupling RF energy to the gas to form a plasma. The support typically comprises dielectric covering an electrode. The gas in the chamber is energized by applying an RF voltage to the electrode and electrically grounding a facing conductor surface in the chamber. The support comprises one or more conduits that extend through the dielectric and electrode, such as gas conduits for supplying heat transfer gas to the interface between the substrate and the dielectric, and other conduits to hold lift-pins that raise or lower the substrate onto the support. It is desirable to extend the edge or extremity of the electrode in the support as close as possible to the conduits to allow a relatively uniform level of RF energy to be coupled to the overlying plasma—even across the electrode gap created by the conduits. However, the proximity of the edge of the electrode to the conduit can result in electrical coupling of the RF energy from the electrode edge to the gas in the conduit. This RF coupling leads to ionization, arcing, and glow discharge of the gas in the conduit. This is undesirable because it causes sputtering, chemical erosion and thermal degradation of the conduit surfaces, the support, and even the backside of the overlying substrate.

Plasma formation in conduits is especially a problem for ceramic dielectric supports. Ceramic supports made from alumina are being increasingly used due to their resistance to chemical erosion and their ability to withstand high temperatures. However, such ceramic supports typically have large diameter conduits because it is difficult to machine small diameter conduits in the brittle ceramic material. A conduit having a large diameter provides a longer pathway in the gap of the conduit for the acceleration of ionized gas molecules. The longer pathway results in a larger number of energetic collisions between charged gas species and other gas molecules which results in avalanche breakdown and plasma formation in the conduit.

Thus there is a need for a support that reduces the incidence of arcing, glow discharge, or plasma formation in conduits that extend through the support during processing of a substrate in the chamber. There is also a need for a support that exhibits reduced erosion and thermal degradation in the chamber. It is further desirable to have a support that provides a more uniform plasma sheath across the surface of the substrate.

SUMMARY

The present invention satisfies these needs by providing a support capable of supporting a substrate and forming a plasma of a gas in a chamber. The support comprises a primary electrode that is chargeable to form the plasma of the gas in the chamber. A dielectric covers the primary electrode, the dielectric having a surface adapted to receive the substrate and a conduit extending therethrough. A thickness of dielectric between the primary electrode and the conduit is sufficiently large to reduce plasma formation in the conduit. The support is particularly useful in a chamber comprising a gas distributor and an exhaust, in which a substrate held on the support is processed by a plasma of gas that is distributed by the gas distributor and exhausted by the exhaust.

In another version, the present invention is related to a support comprising first means for receiving the substrate and providing a first gas below the substrate, and second means for forming a plasma of second gas above the substrate and for reducing plasma formation in the first gas in the conduit during processing of the substrate on the support in the chamber.

In yet another version, the present invention is related to a support comprising a dielectric having a surface adapted to receive the substrate and a conduit. A primary electrode is covered by the dielectric, the primary electrode being chargeable to form a plasma of gas in the chamber, and having an edge around the conduit. A secondary electrode is also covered by the dielectric. Preferably, the secondary electrode is adapted to suppress coupling of energy from the edge of the primary electrode to gas in the conduit during processing of the substrate on the support in the chamber.

In still another version, the present invention is directed to a substrate processing chamber comprising a gas distributor capable of providing gas into the chamber, a dielectric having a surface capable of receiving the substrate and having a conduit therethrough, a primary electrode and a secondary electrode below the dielectric; and a voltage supply adapted to charge the primary electrode with an RF potential to sustain a plasma of gas in the chamber, and electrically bias the secondary electrode relative to the primary electrode to reduce plasma formation in the conduit during processing of the substrate in the chamber.

In another aspect, the present invention is related to a method of fabricating a support for holding a substrate in a chamber. The method comprising the steps of forming a dielectric covering an electrode, and forming a conduit in the dielectric so that a thickness of dielectric between an edge of the electrode and a surface of the conduit is sufficiently large to reduce plasma formation in the conduit when the electrode is charged by an RF voltage during processing of the substrate in the chamber.

In yet another aspect, the present invention is to a method of fabricating the support by the steps of forming a dielectric comprising a conduit, the dielectric covering a primary electrode and a secondary electrode. The primary electrode is chargeable to sustain a plasma of gas in the chamber and the secondary electrode is shaped and sized to suppress coupling of energy from the edge of the electrode to gas in the conduit during processing of the substrate on the support in the chamber.

The present invention is also directed to a method of processing a substrate on a support in a chamber, the support comprising a dielectric having a surface capable of receiving the substrate, the dielectric covering a primary electrode and a secondary electrode and comprising a conduit that extends therethrough. In the method, the substrate is placed on the surface of the dielectric and the primary electrode in the support is maintained at an RF potential to sustain a plasma of gas in the chamber. The secondary electrode is electrically biased relative to the primary electrode to reduce plasma formation in the conduit during processing of the substrate in the chamber. Preferably, the step of electrically biasing the secondary electrode comprises the step of electrically grounding the secondary electrode.

DRAWINGS

These features, aspects, and advantages of the present invention will become better understood with regard to the following description, appended claims, and accompanying drawings which illustrate examples of the invention, where:

FIG. 5b is a schematic sectional top view of the support FIG. 5a;

Figure 12:
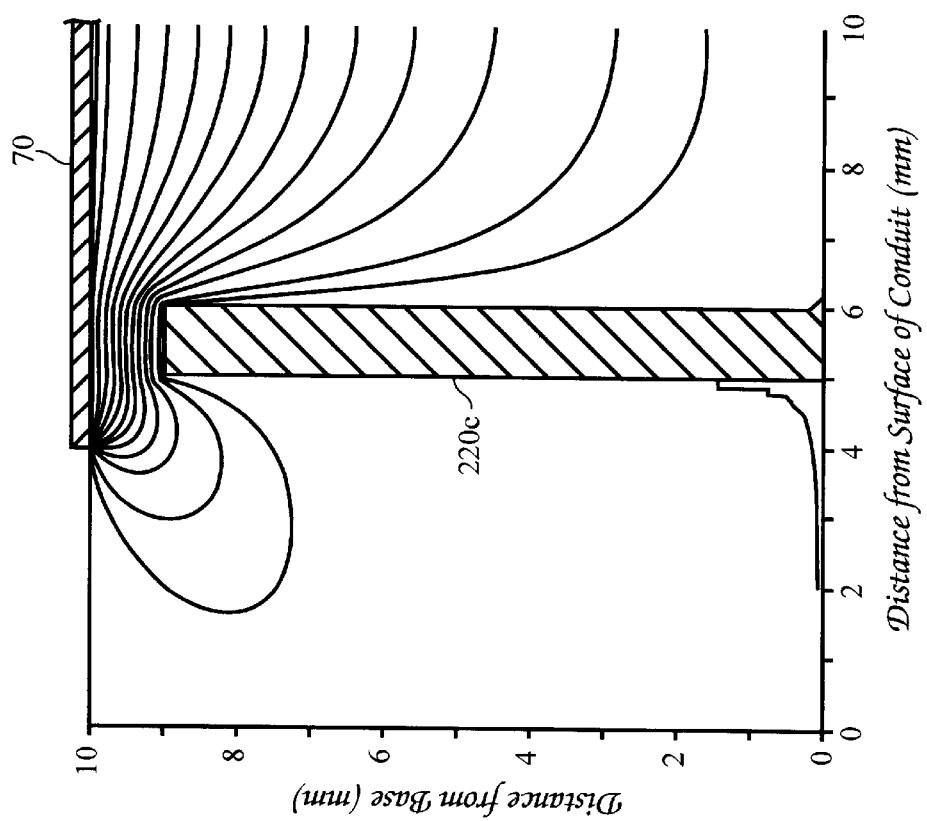
Figure 13:
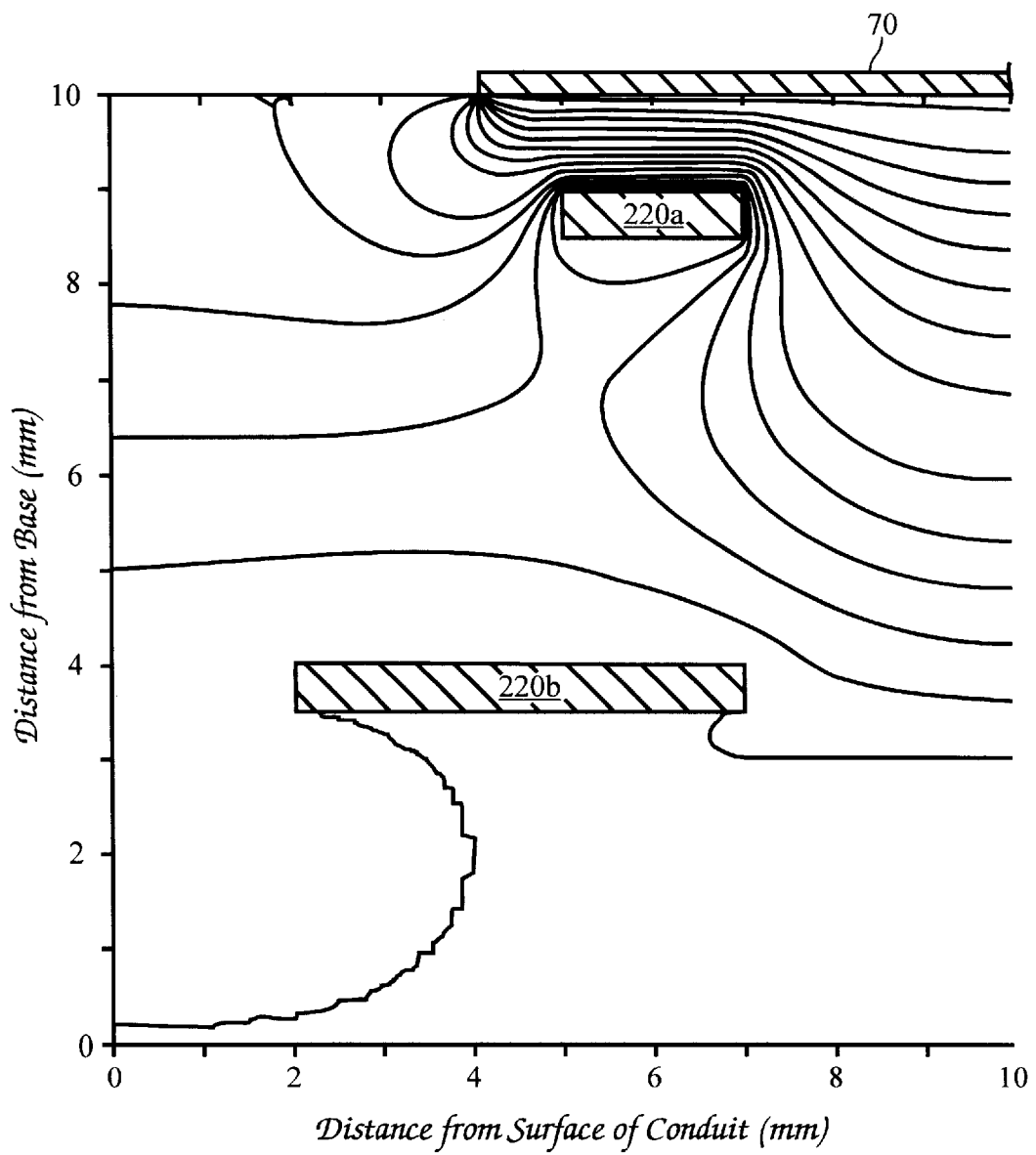

FIG. 12 is a graph of equipotential lines for a support according to the present invention having a primary electrode and a secondary electrode adapted to attract an electric field emanating from an edge of a charged primary electrode; and FIG. 13 is a graph of equipotential lines for a support according to the present invention having a primary electrode and a secondary electrode comprising a plurality of electrode segments.

DESCRIPTION

Figure 1:
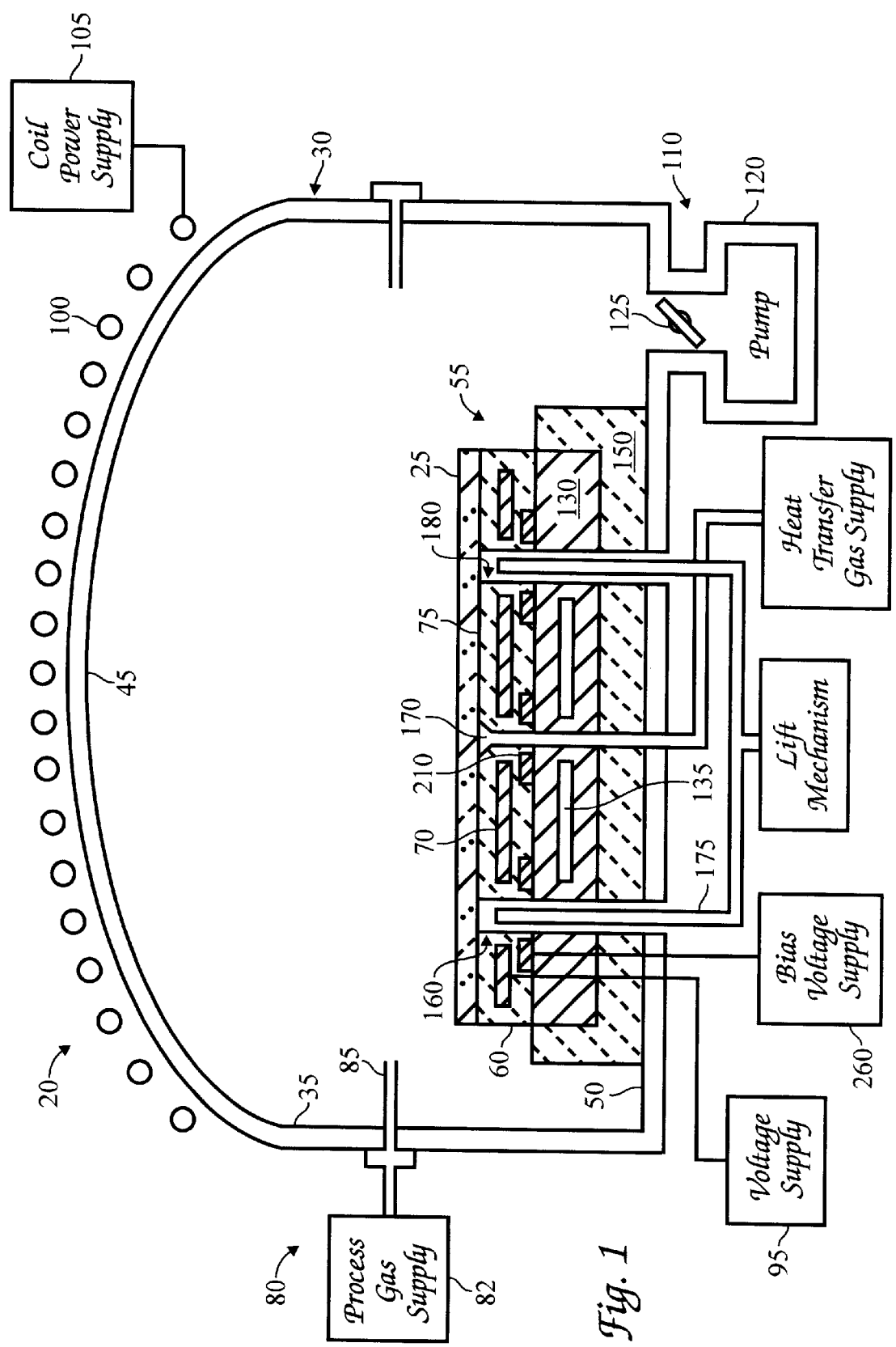
FIG. 1 is a schematic sectional side view of a chamber comprising a support according to the present invention.

FIG. 1 illustrates an apparatus 20 for processing a substrate 25, such as a semiconductor wafer, in an energized gas or plasma. Generally, the apparatus 20 comprises an enclosed chamber 30 having sidewalls 35, upper walls 45 and a bottom portion 50 on which rests a support 55 for holding the substrate 25. The support 55 comprises a dielectric 60 covering a primary electrode 70, the dielectric 60 having a surface 75 for receiving the substrate 25 thereon. Process gas (or first gas) from a gas supply 82 is introduced into the chamber 30 through a gas distributor 80 having a plurality of nozzles 85 that are distributed around the substrate 25. The gas is energized to form a plasma by inductively or capacitively coupling RF energy into the chamber 30. For example, the gas can be energized capacitively by applying an RF voltage from a voltage supply 95 between the primary electrode 70 in the support 55 and a partially facing conducting upper wall 45 of the chamber 30. The apparatus 20 also includes an inductor coil 100 adjacent to the chamber 30 that is powered by a coil power supply 105 to inductively couple RF energy into the chamber 30. Typically the frequency of the RF power applied to the primary electrode 70 and to the inductor coil 100 is from about 50 kHz to about 60 MHZ. The RF power applied to the primary electrode 70 is typically from about 10 to about 5000 Watts and the RF power applied to the inductor coil 100 is typically from about 750 to about 5000 Watts. Spent gas and byproducts are exhausted from the chamber 30 through an exhaust system 110 which typically includes a vacuum pump 120 and a throttle valve 125 to control the pressure of gas in the chamber 30.

Generally, the support 55 further comprises a base 130 for supporting the dielectric 60. Preferably, the base 130 comprises channels 135 through which heat transfer fluid is circulated to heat or cool the substrate 25. More preferably, the base 130 is shaped and sized to match the shape and size of the substrate 25 held on the support 55 to maximize transfer of heat between the base 130 and the substrate 25. For example, for a substrate 25 having a circular or disk shape, the base 130 comprises a right cylindrical shape. Typically, the base 130 comprises an electrically conducting material and is surrounded by an insulating shield or jacket 150. The base 130 is made out of a metal such as aluminum, and the jacket 150 is made from an insulating material, for example, a polymeric or a ceramic material, such as quartz. Optionally, the base 130 can also be electrically biased by the voltage supply 95.

The dielectric 60 of the support 55 isolates the primary electrode 70 from the substrate 25 and the plasma in the chamber 30. The dielectric 60 can comprise a single layer of insulating material overlying the base 130 which serves as the primary electrode 70 (not shown), or a monolith in which the primary electrode 70 is embedded. Preferably, as shown in FIG. 1, the dielectric 60 comprises a monolith in which the primary electrode 70 is embedded to substantially entirely isolate the primary electrode 70 from the plasma. The dielectric 60 is made from a dielectric material that is resistant to erosion by the gas or plasma and capable of withstanding high temperatures. The dielectric 60 comprises an absorption coefficient sufficiently low to allow the RF voltage applied to the primary electrode 70 to capacitively couple to the plasma in the chamber 30. Suitable dielectric materials include, for example, ceramic materials, such as $Al_2O_3$, AlN, BN, Si, SiC, $Si_3N_4$, $TiO_2$, $ZrO_2$, and mixtures and compounds thereof; and polymeric materials such as polyimide, polyamide, polyetherimide, polyketone, polyetherketone, polyacrylate, fluoroethylene, or mixtures thereof. The thickness of the dielectric material overlying the primary electrode 70 is from about 100 $\mu$m to about 1000 $\mu$m to permit an RF voltage applied to the primary electrode 70 to capacitively couple to the plasma in the chamber 30.

The dielectric 60 also comprises one or more conduits 160 extending through the dielectric 60, such as for example, a gas conduit 170 provided to supply heat transfer gas (or second gas) to an interface between the surface 75 of the dielectric 60 and the substrate 25. The heat transfer gas, typically helium, promotes heat transfer between the substrate 25 and the support 55. Other conduits 160 in the dielectric 60 enable lift-pins 175 to extend through the support 55 to lift or lower the substrate 25 off the surface 75 of the dielectric 60 for loading or unloading of the substrate 25. The conduits 160 have an internal surface 180 and are typically from about 10 to about 30 mm long—depending on the thickness of the dielectric 60; and have a polygonal or circular cross-section having a width or diameter of from about 0.1 to about 3 mm.

Figure 2A:
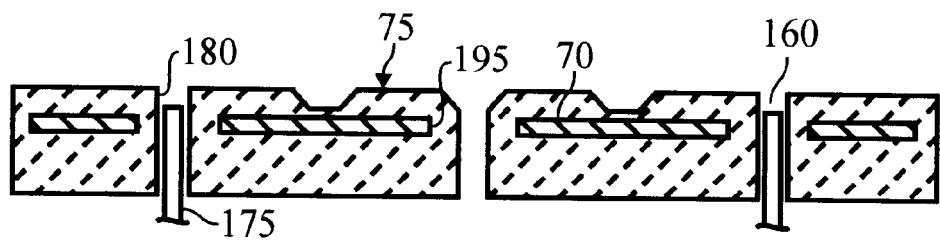
FIG. 2a is a schematic sectional side view of a support comprising a dielectric covering a primary electrode and having conduits.
Figure 2B:
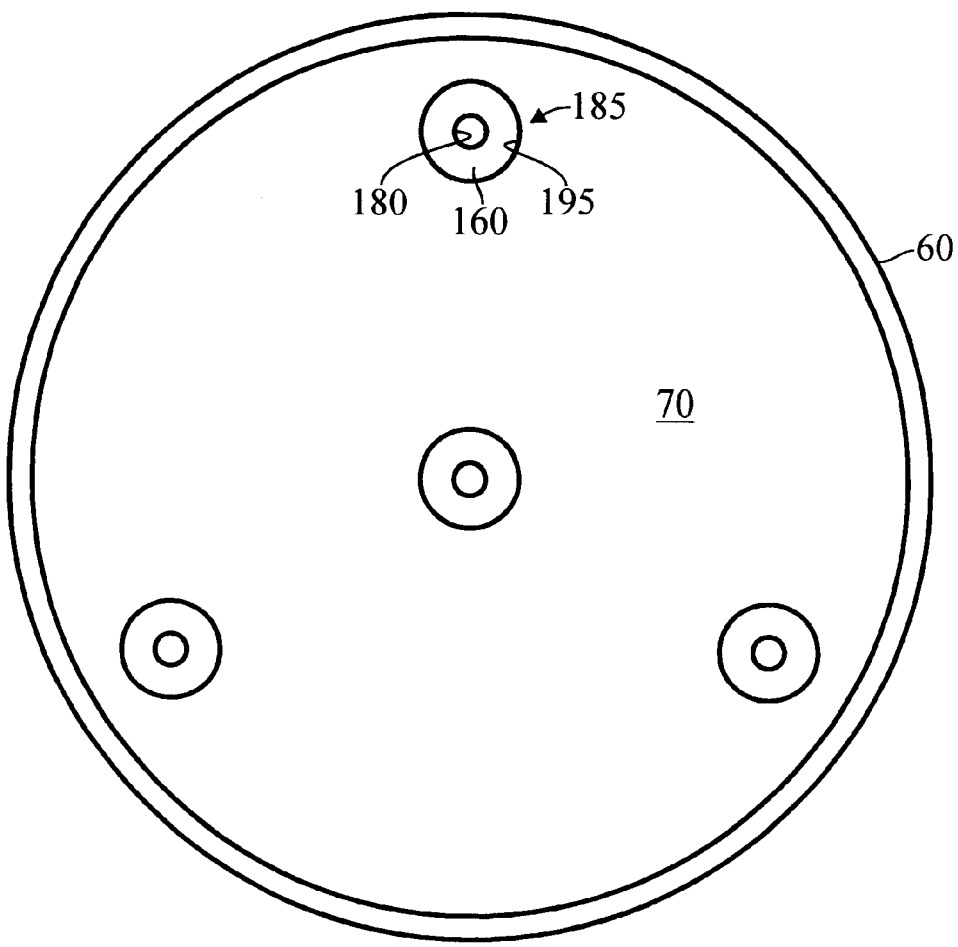
FIG. 2b is a schematic plan view of the support of FIG. 2a showing the shape of the primary electrode and the dielectric separating the conduits from the primary electrode.

The primary electrode 70 is charged by an RF voltage to energize the plasma in the chamber 30 during processing of the substrate 25. The primary electrode 70 comprises an area that is sufficiently large to uniformly couple RF energy to the gas in the chamber 30 and across substantially the entire area of the substrate 25. For example, for a circular substrate 25 having a diameter of 200 to 300 mm (8 to 12 inches), the primary electrode 70 typically comprises an area of from about 30 to about 70,000 mm$^2$. In addition, as shown in FIGS. 2a and 2b, the primary electrode 70 comprises edges 195 around apertures 185 that in turn extend around the conduits 160 in the dielectric 60. The primary electrode 70 can comprise a conductor layer, a mesh of conducting material, or a conducting pattern formed by doping the dielectric 60. Preferably, the primary electrode 70 comprises a mesh or a plurality of interconnected groups of electrode segments fabricated from an electrically conducting material. Suitable electrically conducting materials for the electrode include metal containing materials, such as for example, aluminum, copper, silver, gold, molybdenum, tantalum, titanium, or mixtures thereof.

Optionally, the primary electrode 70 (which is also the power electrode) is capable of being electrically charged to serve as an electrostatic chuck to electrostatically hold the substrate 25 to the surface 75 of the dielectric 60. The primary electrode 70 comprises an area below the substrate 25 that is sufficiently large to electrostatically attract and hold the substrate 25 upon application of a DC voltage to the electrode 70. The primary electrode 70 can comprise either a monopolar or bipolar electrodes. During operation of a monopolar electrode, electrically charged plasma species in the chamber 30 cause electrical charge to accumulate in the substrate 25, thereby providing the attractive electrostatic force that holds the substrate 25 to the dielectric 60. In bipolar mode, the primary electrode 70 comprises first and second groups of electrode segments (not shown) which are electrically isolated from one another and are sized and configured to operate as bipolar electrodes. When bipolar electrode segments are electrically biased relative to one another, the resultant electrostatic force between the electrode segments and the substrate 25 holds the substrate 25 to the dielectric 60.

In one aspect of the present invention, the thickness of a portion of the dielectric between an edge 195 of the primary electrode 70 and the surface 180 of the conduit 160 is made sufficiently large to reduce the incidence of plasma formation in the conduit 160 when the primary electrode 70 is charged by an RF voltage to form a plasma of a gas in the chamber 30. The thickness of dielectric material between the edge 195 of the primary electrode 70 and the conduit 160 can be increased either by reducing the cross-section of the conduits 160 or by forming the edge 195 of the primary electrode 70 that is further away from the surface 180 of the conduit 160. The size of the conduits 160 generally depends upon other design parameters, such as dimensions of the lift-pins 175 or the rate at which heat transfer gas must be supplied. However, forming the edge 195 of the primary electrode 70 at a predetermined distance away from the surface 180 of the conduit 160 serves to increase the thickness of dielectric material between the edge 195 of the primary electrode 70 and the conduit 160 to a thickness that is sufficiently large to reduce plasma formation in the conduit 160. The desired thickness of the gap between the electrode edge 195 and the conduit 160 depends on the RF and DC power levels applied to the primary electrode 70, the pressure of gas in the conduit 160 and the dimensions of the conduit 160. If the dielectric thickness between the edge 195 of the primary electrode 70 and the surface 180 of the conduit 160 is too small, plasma formation can occur within the conduit 160 thereby damaging the support 55 and overlying substrate 25. However, when the dielectric thickness is too large, the primary electrode 70 becomes too small and insufficient RF energy is coupled to the gas above the conduits 160 resulting in formation of a weak spot in the plasma at this region of the substrate 25 that results in poor processing of this region. In addition, if the primary electrode 70 is charged with a DC voltage (to serve as an electrostatic chuck) a primary electrode having an excessively small area results in insufficient electrostatic attraction to hold the substrate 25 to the surface 75 of the dielectric 60. It has been discovered that for conduits 160 having the dimensions given above, a sufficient thickness of dielectric material is from about 2 times to about 200 times the thickness of the portion of the dielectric 60 that overlies the primary electrode 70. Preferably, thickness of the dielectric between the edge 195 of the primary electrode 70 and the surface 180 of the conduit 160 is at least about 3 mm, and more preferably less than about 10 mm.

Figure 3:
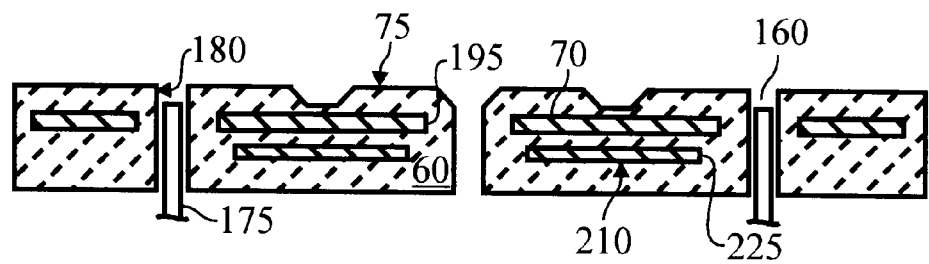
FIG. 3 is a schematic sectional side view of another version of a support comprising a dielectric covering a primary electrode and a secondary electrode that is shaped and sized to suppress coupling of RF energy from an edge of the primary electrode to gas in a conduit.

In another aspect of the present invention, the support 55 further comprises a counter or secondary electrode 210 covered by or embedded in the dielectric 60. The secondary electrode 210 is adapted to attract an electric field emanating from the edge 195 of the primary electrode 70 and away from the conduit 160 during processing of the substrate 25. For example, as shown in FIG. 3, the secondary electrode 210 comprises a perimeter 225 adjacent to and extending along the edge 195 of the primary electrode 70 that circumvents a conduit 160. In operation, the secondary electrode 210 is electrically biased relative to the primary electrode 70 to reduce the incidence of plasma formation in the conduit 160 during processing of the substrate 25. For example, when RF power is applied to the primary electrode 70 the secondary electrode can be electrically grounded.

Preferably, the secondary electrode 210 has a surface comprising an area that is smaller than the area of the primary electrode 70 to reduce wastage of power from the excessive coupling of RF and DC electrical energy from the primary electrode 70 to the secondary electrode 210. Thus, preferably, the secondary electrode 210 comprises a total area that is less than about 5% of the total area of the primary electrode 70. More preferably, the secondary electrode 210 comprises a total area of about 1000 to about 2000 mm$^2$. The total area is the area of an entire surface of the electrode or a sum of the area of the surfaces of a plurality of electrode segments.

Figure 4:
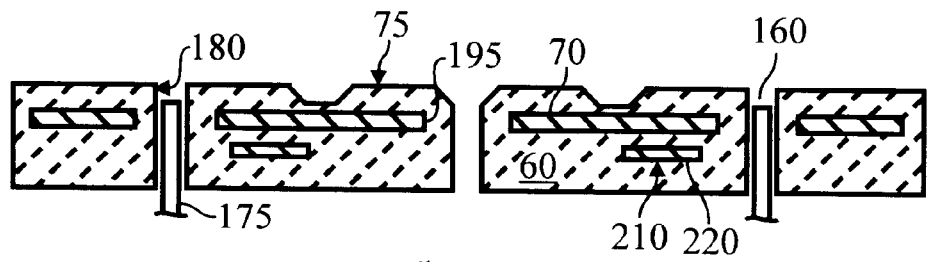
FIG. 4 is a schematic sectional side view of a support having a secondary electrode comprising a collar about an edge of a primary electrode.

In addition, preferably, the secondary electrode 210 is not in the same plane (non-coplanar) as the primary electrode 70 to further increase the separation distance or gap between the secondary electrode 210 and the primary electrode 70. While a larger gap further reduces leakage of RF or DC energy from the primary electrode 70; too large a gap can cause the secondary electrode to be ineffective. Preferably, the secondary electrode 210 is also below the level of the primary electrode 70 to further reduce the attenuation of energy applied to electrode 210. For example, as shown in FIG. 4, the secondary electrode 210 can comprise a thin conducting strip that forms a ring or a collar 220 lying below the level, and about the edge 195, of the primary electrode 70. Like the primary electrode 70, the secondary electrode 210 can comprise a conductor layer, a mesh of conducting material, or a conducting pattern of dopant in the dielectric 60, and the secondary electrode 210 can be made from the same materials as the primary electrode 70.

Figure 5A:
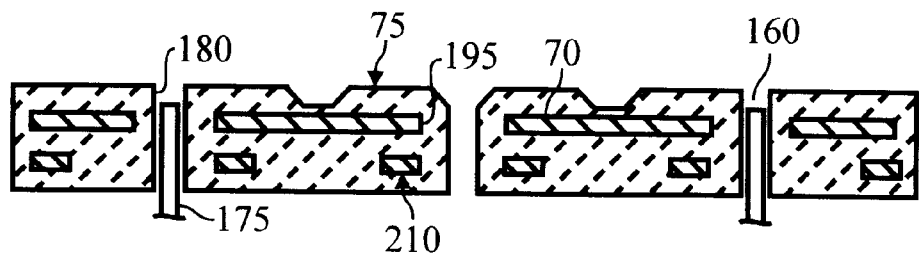
FIG. 5a is a schematic side view of a support having a plurality of secondary electrodes comprising collars positioned around each conduit.
Figure 5B:
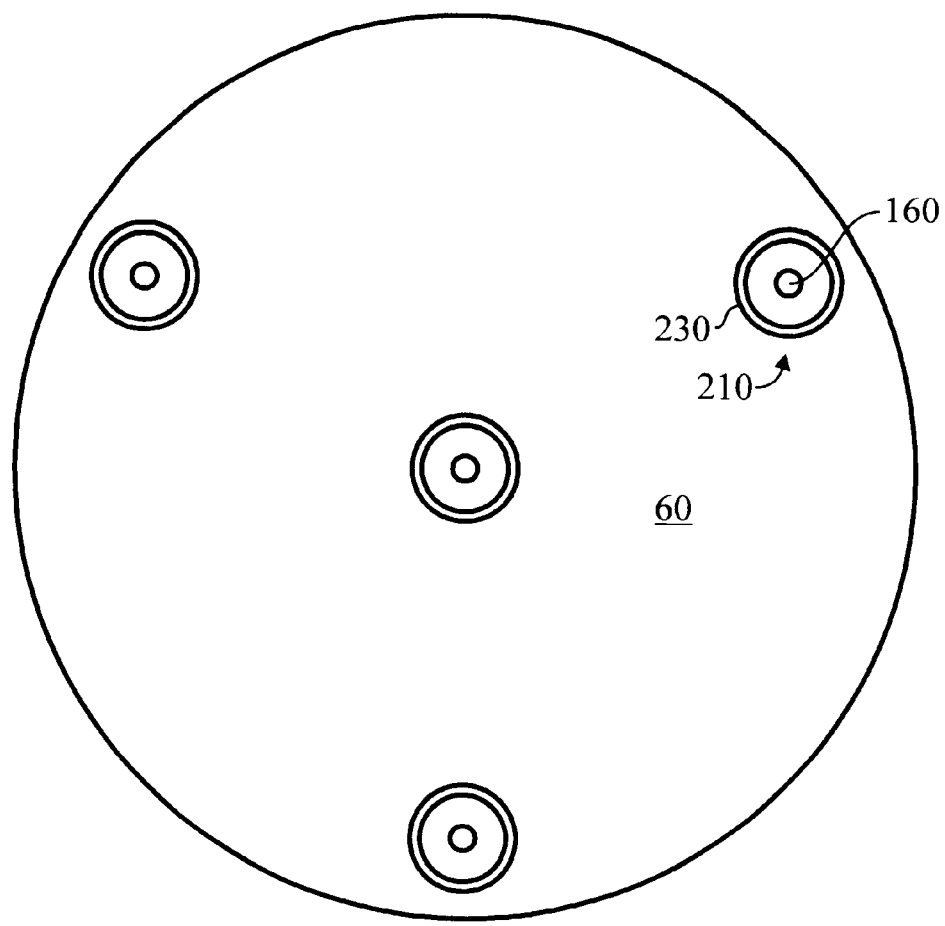

In one version, as shown in FIGS. 5a and 5b, the secondary electrode 210 is shaped as one or more collars 230 that are disposed about and adjacent to the conduits 160. Each collar 230 comprises an inner diameter that is larger than the apertures 185 of the primary electrode 70 and an outer diameter that is sufficiently large to be close to and attract the electric field emanating out from the edge 195 of the primary electrode 70. This version reduces plasma formation in the conduits 160 while also reducing wastage of electrical energy from coupling of RF and DC energy from the primary electrode 70 to the secondary electrode 210 because of the relatively small size of the collar 230.

Figure 6:
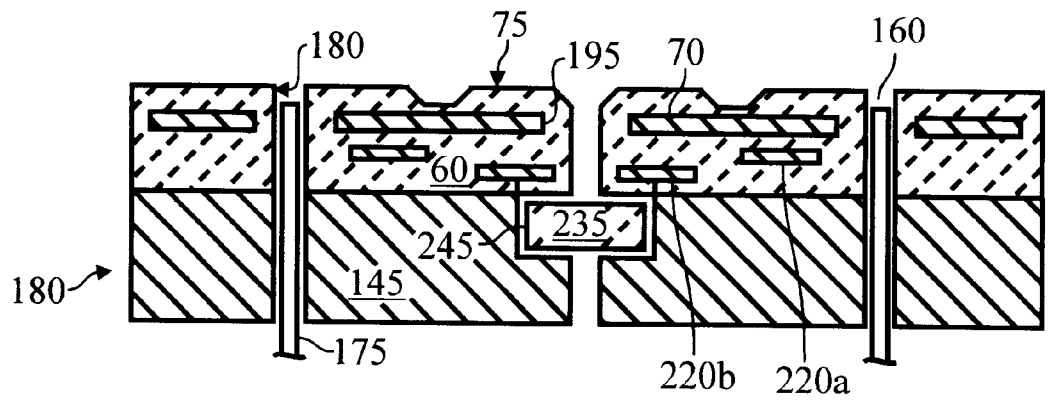
FIG. 6 is a schematic sectional side view of another version of a support showing a secondary electrode comprising a plurality of collars.

In another version, as shown in FIG. 6, the secondary electrode 210 comprises a plurality of primary electrode segments 220a,b. The electrode segments 220a,b are positioned a different distances from the primary electrode 70 and the surface 180 of the conduit 160. This version is particularly useful for embodiments in which the support 55 is supported on a base 130 having a dielectric plug 235 at a lower end of the conduit 160, as shown in FIG. 6. The dielectric plug 235 is made from a polymeric or ceramic material and prevents the primary electrode 70 or the substrate 25 from shorting to the base 130 when a plasma forms in the conduit 160. The heat transfer gas passes through a narrow gap 245 between the base 130 and the dielectric plug 235 to enter the conduit 160. As shown in FIG. 6, a first collar 220a comprising a thin strip of a conductor lying below and adjacent to the edge 195 of the primary electrode 70, attracts the electric field emanating from the primary electrode 70 away from the conduit 160. A second collar 220b, lying over and adjacent to the gap 245 reduces excessive ingress or penetration of the electric field from the primary electrode 70 into the gap 245 between the base 130 and the dielectric plug 235 to reduce the plasma formation therein.

Figure 7:
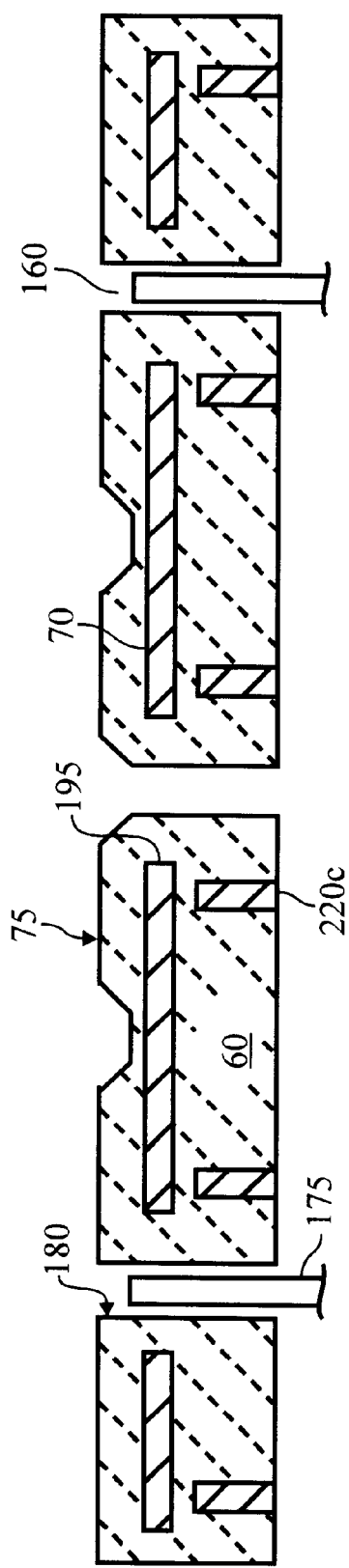
FIG. 7 is a schematic sectional side view of a version of a support showing a secondary electrode comprising a cylindrical collar below and adjacent to a perimeter of an edge of a primary electrode around a conduit.
Figure 8:
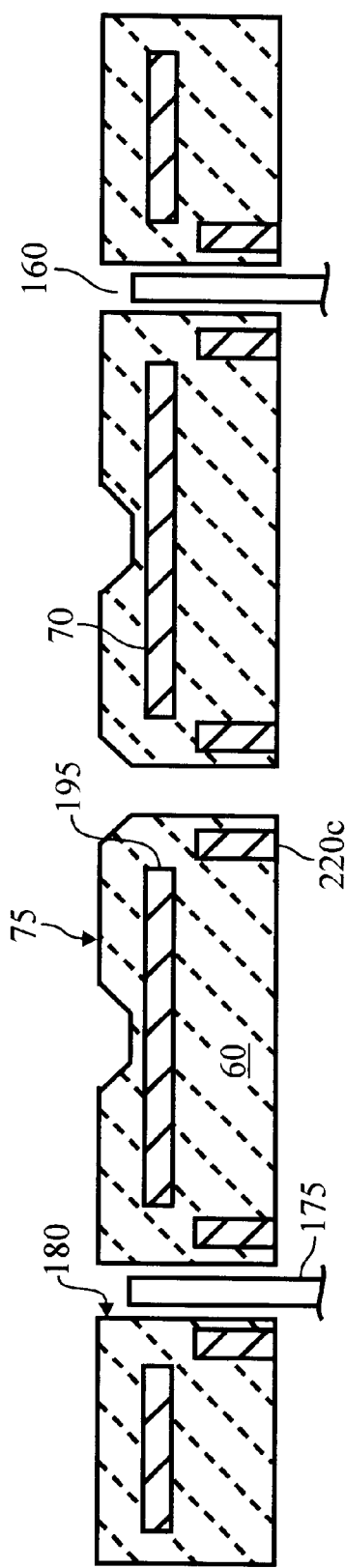
FIG. 8 is a schematic sectional side view of another version of the cylindrical collar of FIG. 7.

In another version, shown in FIG. 7, the secondary electrode 210 comprises a cylindrical collar 220c disposed about the conduit, and lying below and adjacent to the edge 195 of the primary electrode 70. The relatively large surface area of the collar 220c parallel to the conduit 160 suppresses RF coupling from the edge 195 of the primary electrode 70 to the gas in the conduit 160 and substantially eliminates plasma formation in the conduit 160 during processing of the substrate 25. The collar 220c can comprise an inner diameter larger than the aperture 185 of the primary electrode 70 so that the collar 220c is covered by the primary electrode 70, as shown in FIG. 7. Alternatively, the collar 220c can comprise an outer diameter smaller than the aperture 185 as shown in FIG. 8. The increased separation of the collar from the primary electrode 70 further reduces leakage of RF or DC current from the primary electrode 70.

Optionally, the secondary electrode 210 is electrically biased relative to the primary electrode 70 by a bias voltage supply 260. Biasing the secondary electrode 210 enables the strength with which it attracts the electric field emanating from the primary electrode 70 to be changed during processing of the substrate 25. The secondary electrode 210 is electrically biased to reduce wastage of power caused by coupling of RF and DC energy from the primary electrode 70 to the secondary electrode 210 while also reducing the formation of plasma in the conduits 160. This is particularly desirable for processes in which a relatively low voltage is applied to the primary electrode 70. In these processes, the potential for plasma formation in the conduits 160 is low and the loss of power to a grounded secondary electrode 210 due to RF and DC leakage current can be significant. Thus, biasing the secondary electrode 210 to a voltage above ground potential reduces the difference in potential between the secondary electrode 210 and primary electrode 70, both reduces wastage of power from the primary electrode 70 and plasma formation in the conduits 160. Generally, the secondary electrode 210 is biased with a voltage of from about −1000 to about +1000 volts which can be DC or RF voltage. The secondary electrode 210 can also comprise a plurality of electrode segments that are each at a different distance from the primary electrode 70 or from the surface 180 of the conduit 160 and that are each biased to a different electrical potential level. This is particularly useful for a chamber 30 in which different RF voltages are applied to the primary electrode 70 and the base 130. The potential applied to each electrode segment is selected to substantially eliminate plasma formation in the conduit 160 during processing of the substrate 25 while reducing loss of power due to RF leakage current.

EXAMPLES

The following examples show the use of the present invention in reducing the incidence of plasma formation in a conduit 160 when the primary electrode 70 is charged by an RF voltage to energize the plasma ions in the chamber during processing of the substrate 25. These examples are computer simulations of the equipotential lines emanating from the primary electrode 70 for different configurations of the support 55. The computer simulations of the equipotential lines are illustrated graphically in FIGS. 9 to 13. The horizontal axis of the graphs represents distance away from the surface 180 of the conduit 160. The vertical axis represents the distance from the base 130 of the support 55. Thus, FIGS. 9 to 13 can be viewed as a partial sectional side view of the dielectric 60 with the vertical axis representing a section of the surface 180 of a conduit 160, and the horizontal axis representing a section of the lower surface of the dielectric 60. Furthermore, the strength of an electric field (not shown) extending between any two equipotential lines is directly proportional to the difference in potential between the equipotential lines and inversely proportional to the distance between them. Thus, in FIGS. 9 to 13 the closer together the equipotential lines, the stronger the electric field at that point.

Figure 9:
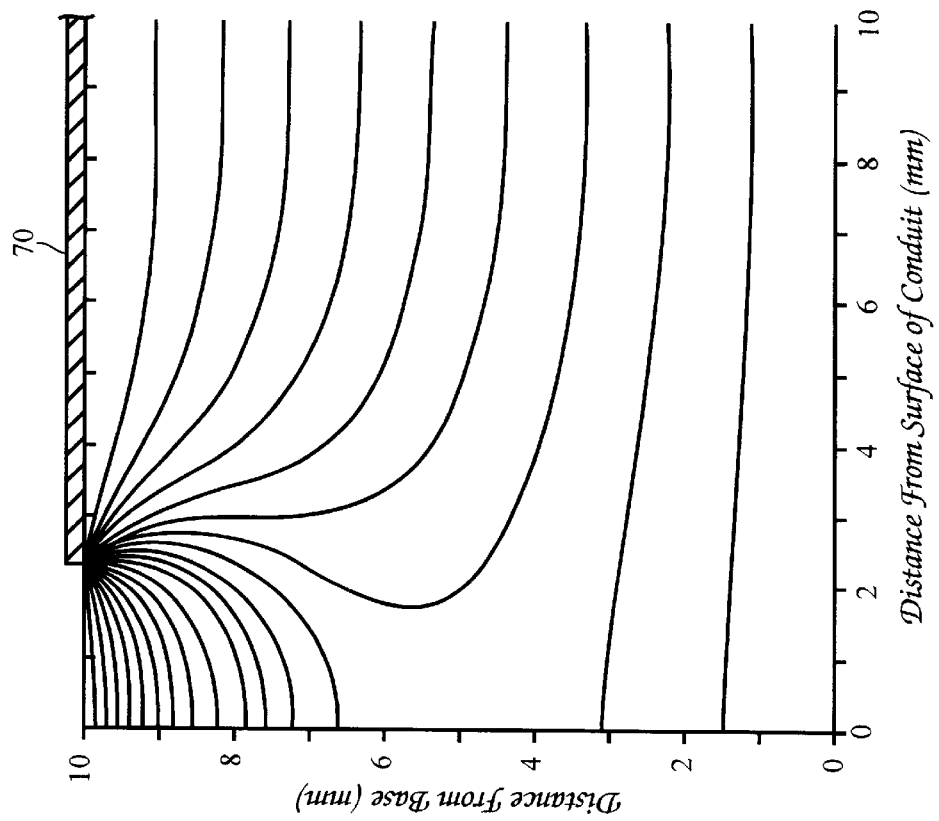
FIG. 9 is a graph of equipotential lines for a conventional support comprising a primary electrode having an edge located 2.5 mm from a surface of a conduit.

FIG. 9 shows the equipotential lines for a conventional support 55 comprising a dielectric 60 covering a primary electrode 70 that extends to within about 2.5 mm of the surface 180 of the conduit 160. In deriving the equipotential lines for FIG. 9, the substrate 25 was assumed to be at a potential of about 500 volts DC, the base 130 was grounded, and 1000 volts peak to peak was applied to the primary electrode 70. The primary electrode 70 can be thought of as a line source that originates at a point 2.5 mm from the vertical axis (2.5 mm from the surface 180 of the conduit) and about 10 mm from the horizontal axis (substantially at the top of the dielectric 60), and extends parallel to the horizontal axis. The clustering of equipotential lines near the top of the surface 180 of the conduit 160 (represented by the vertical axis from 7 to 10 mm) suggest a strong electric field that would lead to plasma formation in the conduit 160.

Figure 10:
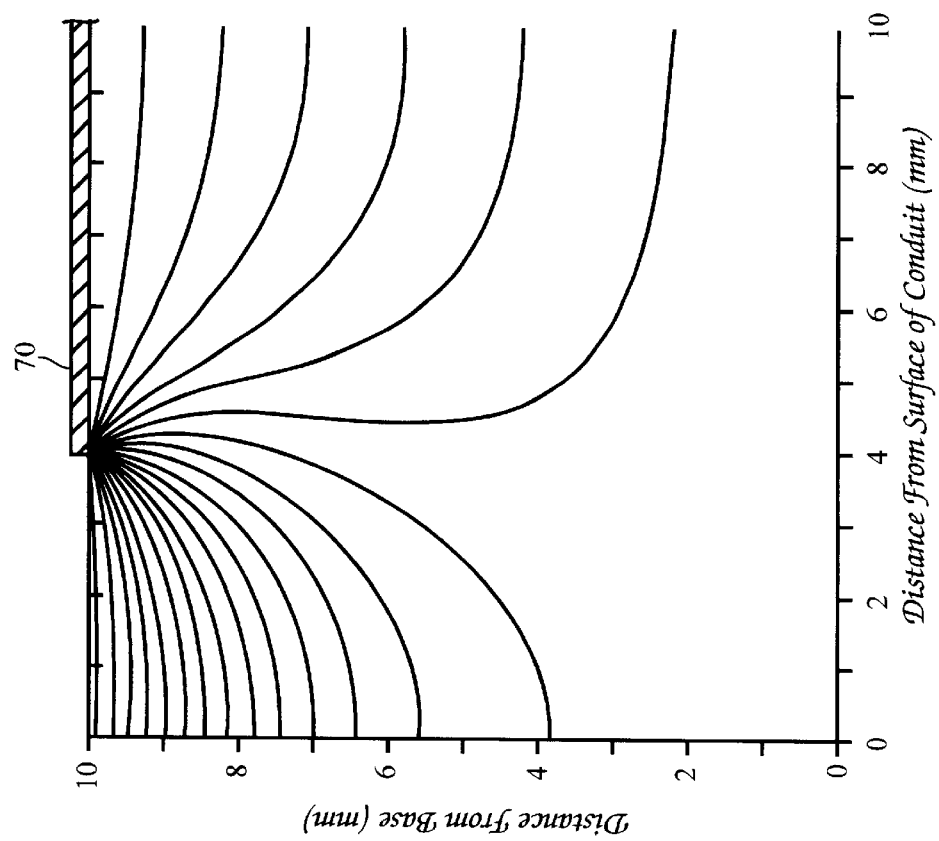
FIG. 10 is a graph of equipotential lines for a support according to the present invention in which a thickness of dielectric between an edge of a primary electrode and a surface of a conduit is about 4 mm.

FIG. 10 shows the equipotential lines for a support 55 according to the present invention in which the thickness of dielectric material between the primary electrode 70 and the surface 180 of the conduit 160 is selected to be about 4 mm. As before the substrate 25 was assumed to be at a potential of about 500 volts DC, the base 130 was grounded, and 1000 volts peak to peak were applied to the primary electrode 70. The equipotential lines intersecting the surface 180 of the conduit 160 (represented by the vertical axis) are spread out suggesting a weaker electric field at the surface 180 of the conduit 160, and a reduced incidence of plasma formation in the conduit 160.

Figure 11:
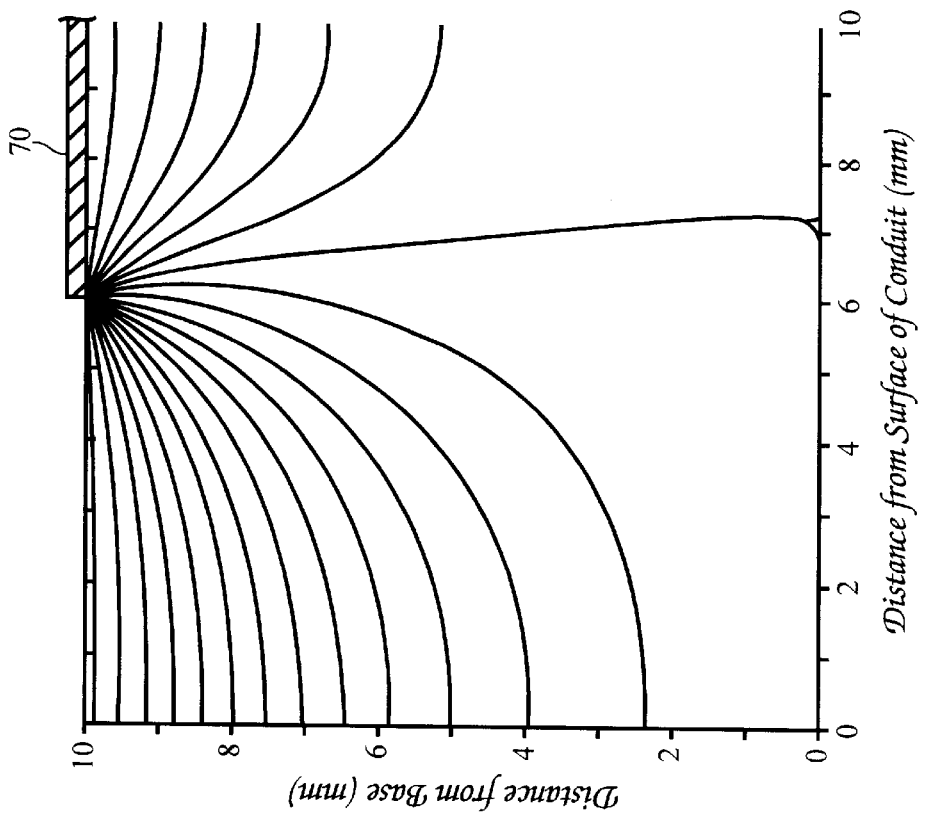
FIG. 11 is a graph of equipotential lines for a support according to the present invention having a primary electrode in which a thickness of dielectric between an edge of a primary electrode and a surface of a conduit is about 6 mm.

FIG. 11 shows the equipotential lines for a support 55 comprising a thickness of dielectric material between the primary electrode 70 and the surface 180 of the conduit 160 of about 6 mm. As in the preceding examples, the substrate 25 was assumed to be at a potential of about 500 volts DC, the base 130 was grounded, and 1000 volts peak to peak were applied to the primary electrode 70. The equipotential lines intersecting the surface 180 of the conduit 160 (represented by the vertical axis) are even more spread out suggesting a still weaker electric field and a further reduced incidence of plasma formation in the conduit 160.

FIG. 12 shows the equipotential lines for a support 55 in which the thickness of dielectric material between the primary electrode 70 and the surface 180 of the conduit 160 is selected to be about 4 mm, and the support 55 further comprises a secondary electrode 210 below and near the edge 195 of the primary electrode 70 as shown in FIG. 7. In this graph, the substrate 25, the base 130, and the secondary electrode 210 were assumed to be at ground potential (0 volts), and 700 volts RF were assumed to be applied to the primary electrode 70. As seen from the equipotential lines which do not intersect the surface 180 of the conduit 160 (represented by the vertical axis) at all, the grounded secondary electrode 210 attracts the electric field emanating from the edge 195 of the charged primary electrode 70 away from the conduit 160. The coupling of RF energy emanating from the edge 195 of the primary electrode 70, to a gas in the conduit 160 is reduced and plasma formation in the conduit 160 is substantially eliminated.

FIG. 13 shows the equipotential lines for a support 55 having a secondary electrode 210 comprising a plurality of collars 220*a,b* as shown in FIG. 6. The first collar 220*a* attracts electric fields that emanate from the primary electrode 70 and the second collar 220*b* prevents the electric fields from penetrating into a gap 245 between the base 130 and a dielectric plug 235 and forming a plasma therein. In deriving the equipotential lines for this graph, the substrate 25 was assumed to be at 500 volts DC and the base at a potential of about −2500 volts peak to peak. The primary electrode 70 was assumed to be about 4 mm from the surface 180 of the conduit 160 and at a potential of about 1000 volts peak to peak. As shown, fewer than five equipotential lines intersect the surface 180 of the conduit 160 (represented by the vertical axis), and these are spread out along the full length of the conduit 160 indicating a greatly reduced electric field and a reduced incidence of plasma formation in the conduit 160.

While the present invention has been described in considerable detail with reference to certain preferred versions, many other versions should be apparent to those of ordinary skill in the art. For example, the secondary electrode 210 can comprise conducting portions of the surface 180 of the conduits 160 themselves. Therefore, the spirit and scope of the appended claims should not be limited to the description of the preferred versions contained herein.

What is claimed is:

1. A support capable of supporting a substrate and energizing a gas in a chamber, the support comprising:

(a) an electrode that is chargeable to energize the gas in the chamber; and (b) a dielectric covering the electrode, the dielectric having a surface adapted to receive the substrate, and the dielectric having a conduit extending therethrough, a thickness of a portion of the dielectric between an edge of the electrode and a sidewall of the conduit being sufficiently large to reduce plasma formation in the conduit.

2. A support according to claim 1 wherein the conduit is adapted to provide heat transfer gas to the surface of the dielectric.

3. A support according to claim 1 wherein the conduit is adapted to hold a lift pin adapted to lift and lower the substrate.

4. A support according to claim 1 wherein the thickness of the portion of the dielectric between the electrode and the conduit is from about 2 times to about 200 times a thickness of the dielectric that overlies the electrode.

5. A support according to claim 4 wherein the thickness of the portion of the dielectric between the electrode and the conduit is less than about 10 mm.

6. A support according to claim 1 wherein the thickness of the portion of the dielectric between the electrode and the conduit is at least about 3 mm.

7. A support according to claim 1 wherein the dielectric comprises a ceramic monolith.

8. A support according to claim 1 further comprising a second electrode covered by the dielectric.

9. A support according to claim 8 wherein the electrodes are not coplanar.

10. A support according to claim 8 wherein one of the electrodes is below the other electrode.

11. A support according to claim 8 wherein the perimeter of one of the electrodes is adjacent to an edge of the other electrode.

12. A support according to claim 8 wherein the second electrode comprises a collar.

13. A support according to claim 8 wherein the electrodes are different sizes.

14. A chamber comprising the support of claim 1, the chamber comprising:

(a) a gas distributor; and (b) an exhaust, whereby a substrate held on the support is processed by a plasma of gas distributed by the gas distributor and exhausted by the exhaust.

15. A support according to claim 1 wherein the edge of the electrode is an edge of a conduit in the electrode.

16. A support capable of supporting a substrate during processing in a chamber, the support comprising:

means for receiving the substrate;

means for providing a first gas below the substrate;

means for energizing a second gas above the substrate; and means for reducing plasma formation in the means for providing a first gas below the substrate during processing of the substrate on the support in the chamber.

17. A support according to claim 16 wherein the first means comprises a dielectric covering an electrode, and the second means comprises a thickness of a portion of a dielectric between an edge of the electrode and a conduit that provides the first gas, the thickness being sufficiently large to reduce plasma formation in the first gas in the conduit.

18. A support according to claim 17 wherein the second means comprises a second electrode covered by a dielectric.

19. A support capable of supporting a substrate in a chamber, the support comprising:

(a) a dielectric having a surface adapted to receive the substrate, the dielectric comprising a conduit;

(b) a first electrode covered by the dielectric, the first electrode being chargeable to energize gas in the chamber, and the first electrode having an edge around the conduit; and (c) a second electrode covered by the dielectric.

20. A support according to claim 19 herein the second electrode is adapted to suppress coupling of energy from the edge of the first electrode to gas in the conduit during processing of the substrate on the support in the chamber.

21. A support according to claim 19 wherein the second electrode is not in the same plane as the first electrode.

22. A support according to claim 19 wherein the second electrode is below the first electrode.

23. A support according to claim 19 wherein the second electrode comprises a perimeter adjacent to the edge of the first electrode.

24. A support according to claim 19 wherein the second electrode comprises a collar disposed about a portion of the first electrode.

25. A support according to claim 19 wherein the second electrode is smaller than the first electrode.

26. A support according to claim 19 wherein a thickness of a portion of the dielectric between the conduit and the edge of the first electrode is sufficiently large to reduce plasma formation in the gas in the conduit during processing of the substrate in the chamber.

* * * * *